United States Patent
Watkins

(10) Patent No.: US 6,728,936 B1
(45) Date of Patent: Apr. 27, 2004

(54) DATAPATH BITSLICE TECHNOLOGY

(75) Inventor: Daniel Watkins, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/425,155

(22) Filed: Apr. 29, 2003

(51) Int. Cl.⁷ .............................................. G06F 17/50
(52) U.S. Cl. ...................... 716/2; 716/1; 716/3; 716/4; 716/9; 716/18
(58) Field of Search ........................... 716/1–8, 11, 18; 718/107; 708/203; 707/201; 703/14; 375/354, 316; 370/532; 365/233; 327/113; 324/158.1

(56) References Cited

U.S. PATENT DOCUMENTS

| | | | | | |
|---|---|---|---|---|---|
| 5,487,018 A | * | 1/1996 | Loos et al. | .................... | 716/11 |
| 5,541,850 A | * | 7/1996 | Vander Zanden et al. | .... | 716/18 |
| 5,771,182 A | * | 6/1998 | Baker et al. | ................. | 708/203 |
| 6,216,252 B1 | * | 4/2001 | Dangelo et al. | ............... | 716/1 |
| 6,513,143 B1 | * | 1/2003 | Bloom et al. | .................... | 716/3 |
| 6,587,990 B1 | * | 7/2003 | Andreev et al. | ................ | 716/2 |
| 6,629,293 B2 | * | 9/2003 | Chang et al. | ................... | 716/4 |
| 6,631,470 B2 | * | 10/2003 | Chang et al. | ................... | 716/3 |
| 2002/0168041 A1 | * | 11/2002 | Suzuki et al. | ................ | 375/354 |
| 2003/0145304 A1 | * | 7/2003 | Carter | ......................... | 716/18 |

* cited by examiner

*Primary Examiner*—Matthew Smith
*Assistant Examiner*—Helen Rossoshek
(74) *Attorney, Agent, or Firm*—Christopher P. Maiorana, P.C.

(57) ABSTRACT

A method for reducing circuit gate count is disclosed. The method generally comprises the steps of (A) generating a new file from a source file and a parameter file, wherein the source file comprises a first circuit defined in a hardware description language, the new file comprises a second circuit defined in the hardware description language, the parameter file comprises a second clock frequency for the second circuit that is faster than a first clock frequency for the first circuit, and the first circuit is functionally equivalent to the second circuit, (B) generating a first gate count by synthesizing a first design from the source file, (C) generating a second gate count by synthesizing a second design from the new file and (D) generating a statistic by comparing the first gate count to the second gate count.

35 Claims, 9 Drawing Sheets

DATAPATH BITSLICE TECHNOLOGY

FIELD OF THE INVENTION

The present invention relates to a circuit design generally and, more particularly, to datapath bitslice technology.

BACKGROUND OF THE INVENTION

Conventional designs for complex circuits begin with defining the functionality of the circuit in a high level hardware description language, such as a register transfer language (RTL). From an RTL file, the circuit is synthesized to a gate level design in hardware. Typical existing RTL defined circuits have a variety of clocks used across various modules of the circuit. Any digital logic within a module that is not running at an upper speed limit of the fastest clock, especially logic in a datapath, can have an inefficient layout in terms of gate count and thus silicon size. The datapath is typically the part of the design that has a number of bits in width on which processing is performed. Therefore, one or more modules not leveraging faster clocks that are typically available are not optimized in size or gate count.

SUMMARY OF THE INVENTION

The present invention concerns a method for reducing circuit gate count. The method generally comprises the steps of (A) generating a new file from a source file and a parameter file, wherein the source file comprises a first circuit defined in a hardware description language, the new file comprises a second circuit defined in the hardware description language, the parameter file comprises a second clock frequency for the second circuit that is faster than a first clock frequency for the first circuit, and the first circuit is functionally equivalent to the second circuit, (B) generating a first gate count by synthesizing a first design from the source file, (C) generating a second gate count by synthesizing a second design from the new file and (D) generating a statistic by comparing the first gate count and power to the second gate count and power.

The objects, features and advantages of the present invention include providing a datapath bitslice technology that may provide (i) generation of reduced size logic without changing functionality, (ii) operation at a faster clock rate, (iii) an architecture for datapath bitslicing, (iv) constraint features within the datapath bitslice technology and/or (v) automated iteration of circuit size reduction.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The following terminology may be useful in describing the datapath bitslice technology (DPT) of the present invention. A register transfer level language (RTL) is usually manifested as the VHSIC hardware descriptor language (VHDL) or the Verilog language. A DBT control (DBTC) section may be generated from a DBT tool (DBTT). The DBTT may be a tool used to automate state machines and/or control signals for controlling reduced (e.g., lower gate count and smaller size) datapaths. A multi-cycle bitslice logic wrapper (MBLW) may be a logic block that may provide data conversions at the boundaries between the reduced datapaths and normal, non-reduced logic modules and/or blocks. A bitslice emulation wrapper for memory (BEWM) may be a logic block that interfaces normal memory modules with reduced datapath logic. A unified memory architecture (UMA) may be logic that enables a single memory device to be used. A static timing analysis (STA) may an analysis tool used as part of a sign-off flow or process for an application specific integrated circuit (ASIC) and/or an application specific standard part (ASSP). A clock may be abbreviated as CLK. As state machine may be abbreviated as "SM". A mixed signal may be abbreviated as MXS. Datapaths having multi-bit widths, but generally no control signals, including sequencers, may be likely candidates for application of the DBT.

The DBT approach generally parses existing RTL blocks of code and generates a logic equivalent that may be reduced in gate count and/or physical size but runs at a faster clock rate re-using the logic multiple times to emulate the overall source function of the original circuit. The DBT may be manifested as another step between RTL development and synthesis of a hardware design. The reduced size and the higher clock rate of the reduced logic blocks or modules tends to provide a negligible power difference between the existing design and a DBT-based solution. Therefore, thermal items or sources on a chip package are generally not significantly different under the present invention. Boundary scan testing may be slightly effected in that there may be fewer flip-flops to scan after reducing one or more modules using the DBT.

Figure 1:
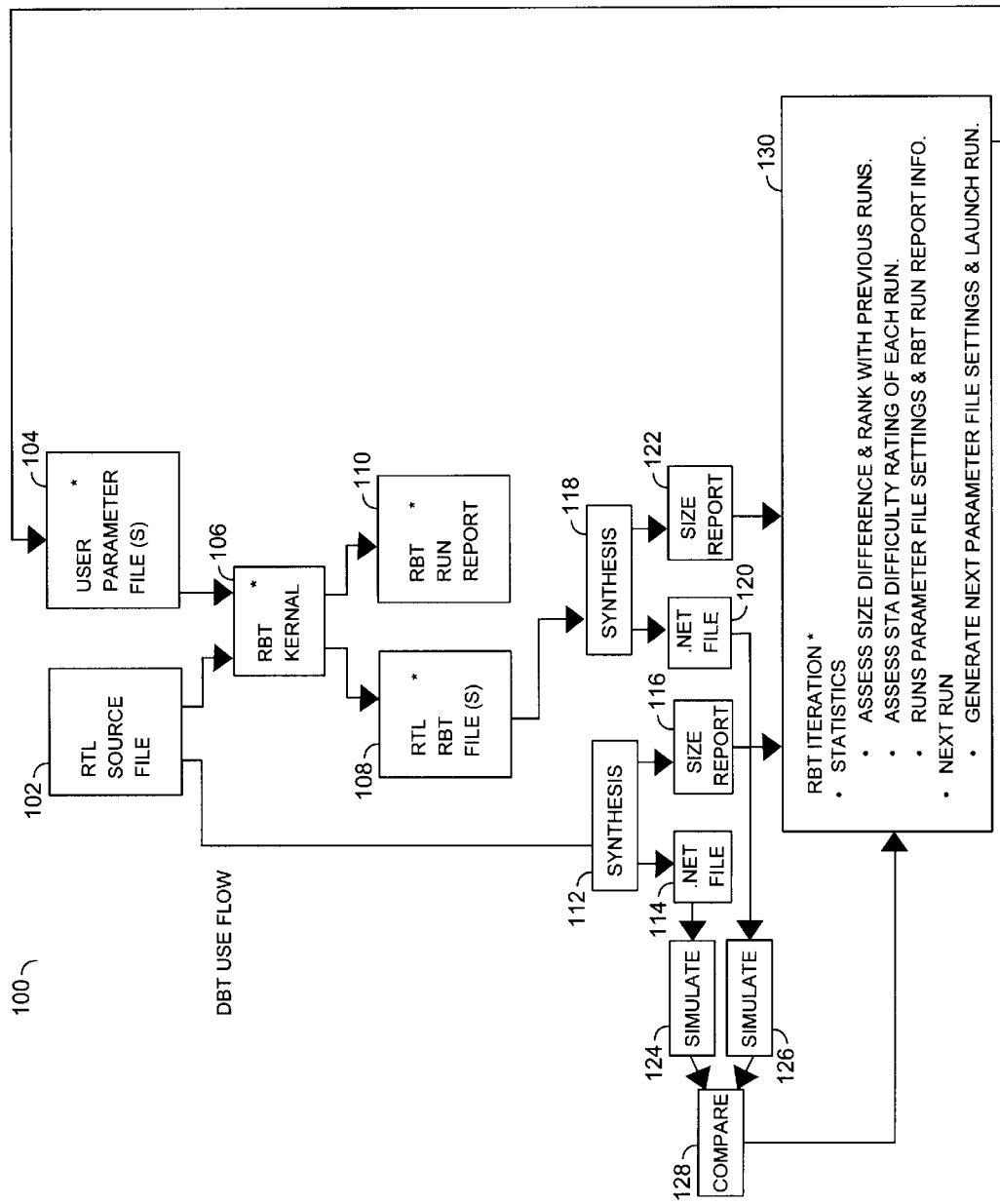
FIG. 1 is a block diagram of method for developing a circuit design in accordance with a preferred embodiment of the present invention.

Referring to FIG. 1, a block diagram of method 100 for developing a circuit design is shown in accordance with a preferred embodiment of the present invention. A user may gather one or more VHDL and/or Verilog RTL source files 102 for reduction in size using the DBT process. The user generally defines parameters for the DBT process in one or more parameter files 104. A DBT tool 106, also referred to as a reduced bitslice technology (RBT) or kernel, may be run to generate an RTL RBT file 108 and a run report file 110. The RTL RBT file 108 generally conforms to the constraints provided in the parameter file 104. The run report file 110 generally provides messages and statistics on the run of the RTL source file 102 through the RBT kernel 106.

A synthesis 112 may be performed on the RTL source file 102 to generate a normal design captured in a netlist file 114.

The synthesis operation 112 may also generate a size report 116 having a gate count and/or physical size information for the normal design. Another synthesis 118 may be performed on the RTL RBT file 108 to generate a new design captured in a netlist file 120. The synthesis operation 118 may also generate a size report 122 having a gate count and/or physical size information for the new design. From the netlist files 114 and 120, design simulations 124 and 126 may be performed to generate functional information for the functionality of each design.

Equivalence checking operations or simulations 128 may be used to confirm that the new design implementing the bitslice solution may function the same as the normal design implementing the functionality from the RTL source file 102. Results from the equivalence checking operation 128 may be feed into an RBT iteration process 130. The iteration process 130 may also receive the size report 116 for the normal design and the size report 122 for the new design. The iteration process 130 may generate statistics by comparing the size reports 116 and 122. The statistics may also take into account any functional differences detected by the equivalence checking operation 128. From the statistics, the DBT may automatically update the user parameter file 104 for a subsequent run. The next run of the RBT kernel 106 with the updated parameter file 104 may be launched automatically and the entire process repeated to generate updated statistics. The automated updating of the user parameter file 104 and automated launching of another run by the RBT kernel 106 may continue for multiple cycles until a predetermined end criteria is reached. The criteria may be performance based in considering the new design compared with the normal design or a prior new design. The criteria may be non-performance based, such as a maximum number of cycles for updating the user parameter file 104.

Figure 2:
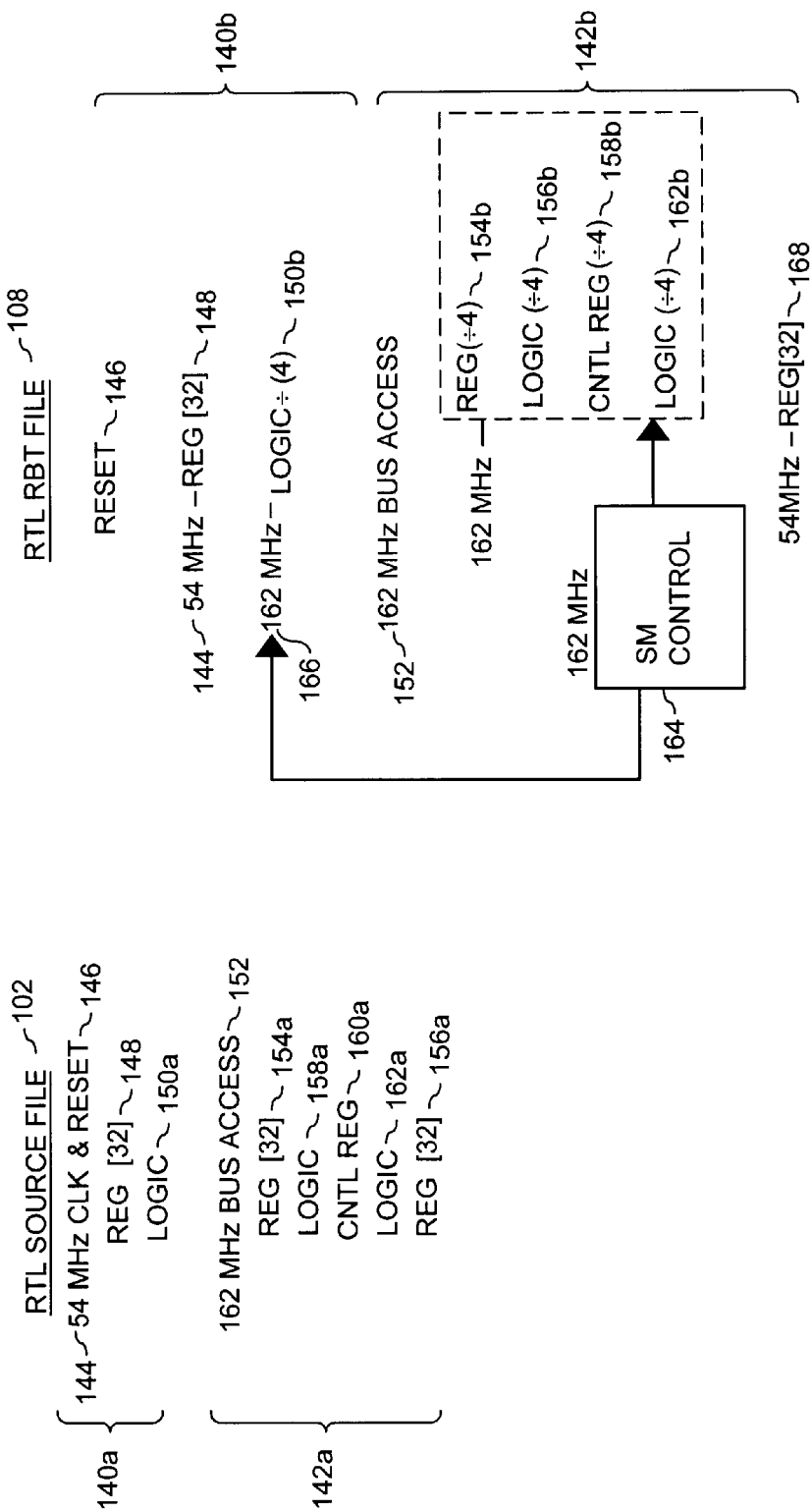
FIG. 2 is a diagram comparing example modules from a source file with equivalent example modules from a reduced file.

Referring to FIG. 2 a diagram comparing example modules from the RTL source file 102 with equivalent example modules from the resulting RTL DBT file 108 is shown. In the example, the RTL source file 102 may define a first module 140a and a second module 142a. The first module 140a may have a 54 MHz clock signal 144, a reset signal 146, one or more 32-bit registers 148 and a logic block 150a configured to perform a first function. The second module 142a may have a 162 MHz bus access operation 152, multiple 32-bit registers 154a and 156a, a logic block 158a configured to perform a second function, one or more control registers 160a, another logic block 162a configured to perform a third function.

The RTL RBT file 108 may be generated to emulate the circuit defined in the RTL source file 102. In the example, the RTL RBT file 108 may define a first module 140b, a second module 142b and a state machine control block 164. The first module 140b may have the reset signal 146, the 32-bit registers 148 operating from the 54 MHz clock signal 144 and a logic block 150b operating from a 162 MHz (e.g., 54 MHz×3) clock signal 166. The logic block 150b may be configured to perform the first function the same as the logic block 150a. A difference between the logic blocks 150a and 150b may involve the logic block 150b arranged to perform the first function in three passes through the logic with each pass consuming only a third of the time used by the logic block 150a. Timing and control of the three passes may be governed by the state machine control block 164.

The second module 142b may include the 162 MHz bus access function 152, two sets of registers 154b and 158b, a logic block 156b, another logic block 162b and one or more registers 168 arranged to transfer signals into and out of the module 142b at the rate of the 54 MHz clock signal 144. The module 142b may be arranged to emulate the module 142a using the faster 162 MHz clock signal 166 processing the data during three passes through the module 142b. The registers 154b and 168b in the module 142b may emulate the functionality of the registers 154a and 156a in the module 142a. However, since data is processed by the module 142b in multiple passes, the registers 154b, 158b and 168b may be fewer in number and/or narrower in bit-width than the registers 154a, 156a and 160a. The logic block 156b may be operational to duplicate the second function of the logic block 158a. The logic block 162a may be operational to duplicate the third function of the logic block 162a.

The parameter file 104 may provide the constraints and other information used by the RBT kernel 106 during a run. The general DBT process may be scalable to any RTL design in any process technology. The parameters file 104 may contain one or more constraints that may control generation of the RTL RBT file 108. A size constraint may indicate if a minimum size is a priority, if a minimum size with a certain clock rate is a priority, or if minimum size is not a top priority. A memory select constraint may have several options including, but not limited to, defaulting to an existing memory size (e.g., no change in size from the RTL source file 102 to the RTL RBT file 108), adding wrapper logic for bitslice write and/or read with BEWM without changing a memory size, and changing a size of the memory.

Figure 3:
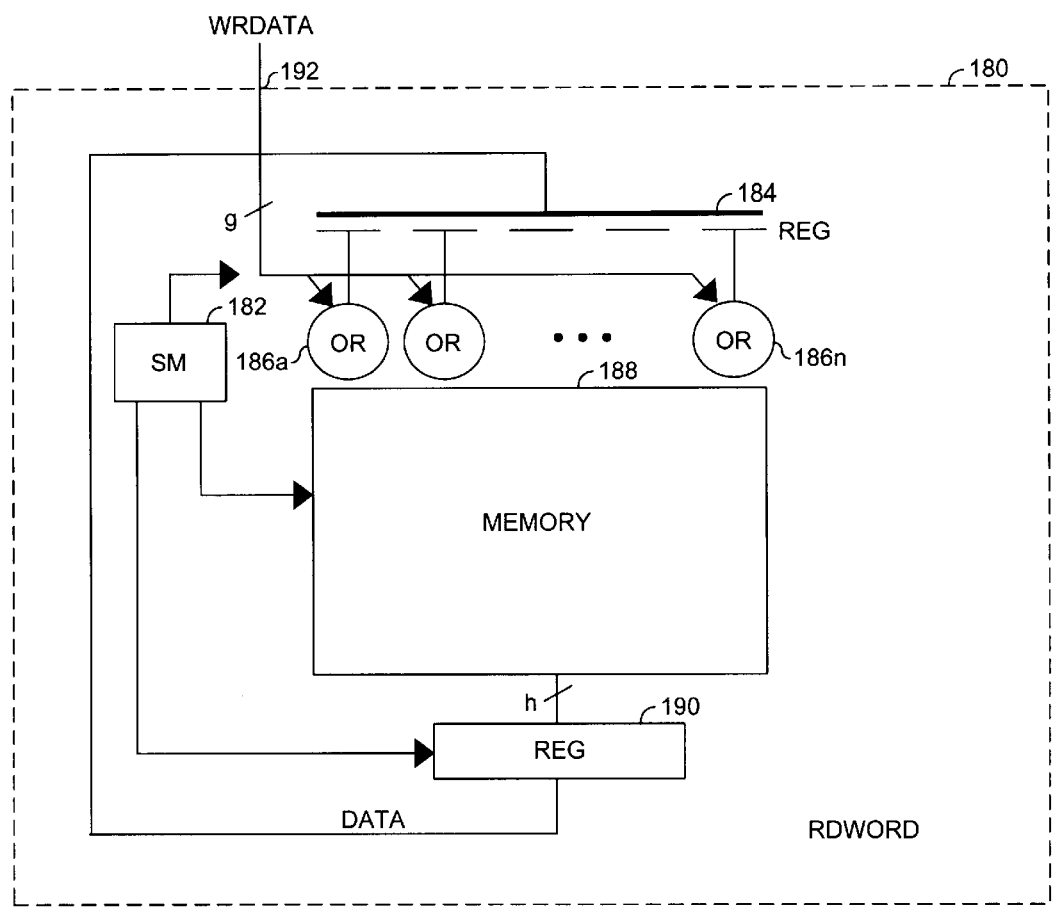
FIG. 3 is a block diagram of an example implementation of a generic structure for a bitslice emulation wrapper memory.

Referring to FIG. 3, a block diagram of an example implementation of a generic structure for a bitslice emulation wrapper memory (BEWM) 180 is shown. The BEWM 180 generally comprises a state machine block 182, a register 184, multiple logic blocks 186a–n, a memory block 188 and an optional register 190. An interface 192 may provide write data (e.g., WRDATA). The register 184 and logic blocks 186a–n may be used to temporarily store and route g-bit wide data WRDATA into an h-bit width of the memory block 188, where h>g. For example, the memory block 188 may be organized as 32-bit words whereas write data may be received as 8-bit bytes. To store a new write data WRDATA value in the memory block 188, a current data value of a 32-bit word (e.g., DATA) in the memory block 188 may be read into the register 184. The state machine block 182 controls the logic blocks 186a–n to route the data WRDATA and the appropriate bits stored in the register 184 into the appropriate positions to generate a new 32-bit word incorporating the value from the data WRDATA. The new 32-bit word may then be written into the memory block 188.

The parameters for the BEWM 180 may include, but are not limited to, a bitslice width (e.g., g-bits), a memory width (e.g., h-bits) and an option to add a register state store (e.g., the register 190). If the register state store is implemented, the memory block 188, if also implemented, may be expanded to support interfacing to the register 190.

Additional constraints for the user parameter file 104 may include an interface constraint for block interface options. The block interface option may include keeping or maintaining timing of one or more existing input registers and output registers the same for reduced modules in the RTL RBT file 108 as the functionally equivalent modules in the RTL source file 102. The block interface option may also instruct the RBT kernel 106 to bitslice input and output registers in the reduced modules for the RTL RBT file 108 as compared with the same functional modules in the RTL source file 102.

Another constraint may define bitslice clock option. The bitslice clock option generally permits a user to enter an existing clock rate and enter a multiple of the existing clock rate from which a bitslice clock rate may be calculated. Another option may be for the user to specify the bitslice clock rate directly and then the RBT kernel 106 may calculate a conversion ratio between the bitslice clock rate and a normal clock rate in the RTL source file 102.

A bitslice select constraint may specify sections or portions of the RTL source file 102 prohibited from being bitsliced. In practice, the user may enter a list into the parameter file 104 identifying line numbers in the RTL source file 102 barred from modification by the RBT kernel 106. For example, registers that may be control registers may be pointed to by the parameter file 104 to be kept as-is when generating the RTL RBT file 108.

A bitslice architecture constraint may allow the user to select if a last cycle for a refined register set conclusion of a multiple cycle bitslice process should be implemented or not. If implemented, a register may be added to an output interface of a reduced module in the RTL RBT file 108 to collect results from individual processing passes for presentation as a single result. The single result implementation may be useful in situations where a subsequent module receiving the result may be a non-reduced module. In situations where the subsequent module is another reduced module, the register may be skipped since the subsequent module may accept the result generated after each processing pass, one after another in a pipeline fashion.

A generated RTL preference constraint may be used to establish default conditions. For example, a portion of the generated RTL preference constraint may set a default to size optimization on all blocks. Another portion may set a default size optimization performance on only certain block types (e.g., multiplexers, registers, adders, gates, and the like). Other constraints may be implemented for the user parameter file 104 to meet the criteria of a particular implementation.

Operation of the DBT tool, and in particular for the RBT kernel 106, generally involves several operations and several guidelines. For example, stub connections between reduced modules and non-reduced modules may maintain existing timing in terms of relative clock speeds. Generally no changes are made to any reset signal or signals. Boundary scan logic is generally not considered and may be accounted for after a synthesis of the design has completed. Modules and blocks processed together should all be from a single clock domain. If multiple clock domains exist, the modules and blocks may be segmented into files each having a single clock domain for processing by the tool.

The tool may assess the existing clock rate from the RTL source file 102 and the target bitslice clock rate from the user parameter file 104. From the assessment, the tool may select a datapath bit-width (e.g., architecture) that closest meets the criteria. An additional "last cycle" may sometimes be added to the architecture for refined full-width register set conclusion to a multiple cycle bitslice process within a given reduced module. The added last cycle generally causes the reduced module to present data as if no change had taken place to the datapath.

A state machine block may be added to the architecture to sequence data entry, data output and bitslice processing within a reduced module. The state machine block may control the overall the module input/output to be the same as defined in the RTL source file 102, except for the higher speed clock(s) added as appropriate.

The RTL RBT file 108 may be configured to be fully RTL compliant. The datapaths and optionally the structure of the added RTL modules and blocks may also be defined in the file 108.

The RBT report file 110 may provide information regarding a current run of the RBT kernel 106. The information may include, but is not limited to, a time of the run, an output file name, and statistics for the run. The RBT report file 110 may include an identification of the bitslice architecture used to generate the reduced modules in the RTL RBT file 108, identification of new clocks created, identification of existing clocks used and status of preserved registers from the RTL source file 102. In addition, the RBT report file 110 may identify any operational differences that might cause the equivalence checker operation or simulation 128 runs to show a fundamental difference at the I/O level, differences in flip-flops for which boundary scan logic may be added, and any reset signals added.

Runtime progress messages and error messages may be generated as part of the RBT report file 110. Suggestions for a synthesis run to assess differences in gate size between a first design synthesized from the RTL source file 102 and a second design synthesized from the RTL RTB file 108. The report file 110 may state if several goals or criteria may be achievable such as sufficient memory access performance. There may be cases where, when moving to a bitslice architecture, the memory access may be improved to match a targeted faster clock rate. The report file 110 may also state if the bitslice logic performance may be sufficient as determined by a static timing analysis with the memory considered.

The RBT iteration process 130 may permit the DBT to automate optimization of the parameters in the user parameter file 104. The iteration process 130 may automatically generate updated or next parameter file settings in the parameter file 104 and launch another run of the RBT kernel 106. Automation for the next parameter file generation as well as the related runs may be configured such that the runs may be substantially independent of each other. Iterating may assess the size difference across the accumulated runs to provide a ranking in terms of which run/result may be closest to achieving the constraints and goals. Suggestions may also be generated on which solution candidates may potentially have static timing analysis challenges and what the challenges may be. The iterations may help determine if the target bitslice clock rate is substantially more than the current clock rate. A significantly faster bitslice clock rate generally indicates a possibility for some problems getting the bitslice design to meet one or more timing criteria. A substantial increase in a number of signals used for the bitslice design relative to the existing design may be an indication of routing complexity challenges expected in the static timing analysis.

In an advanced version of the DBT iteration, the DBT tool may parse the entire RTL source file 102, mining for DBT candidate datapaths to process. The resulting RTL RBT file 108 may identify the candidate paths into the iteration process 130 and the parameter file generation for each of the paths to be processed. The parameter file 104 may then use the maximum clock rate located in VHDL/Verilog code, unless defined by user.

Figure 4:
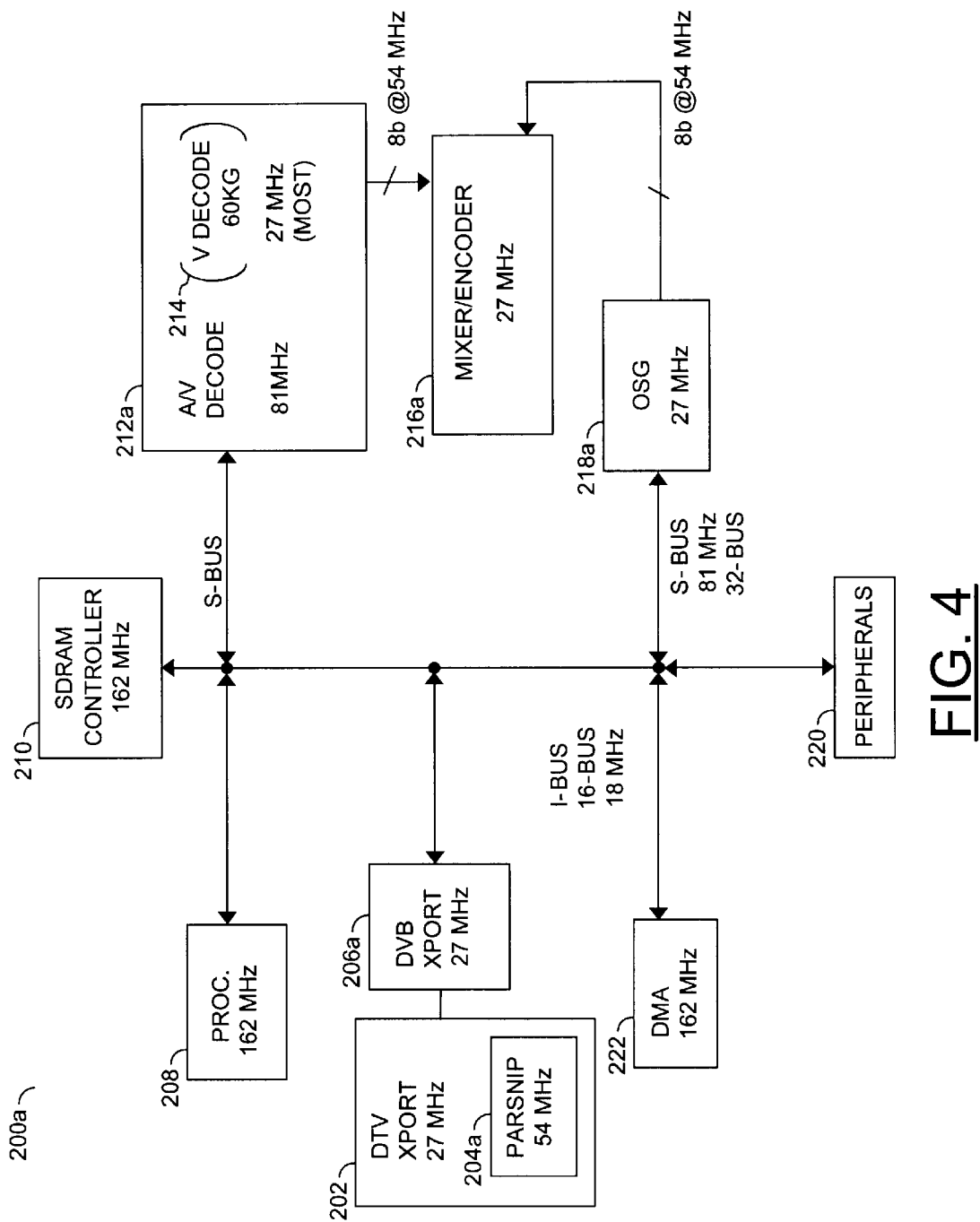
FIG. 4 is a block diagram of an example digital video decoder.

Referring to FIG. 4, a block diagram of an example digital video decoder 200a is shown. The decoder 200a generally comprises a digital television Xport 202 having a parsnip block 204a, a digital video broadcast Xport 206a, a processor 208, a memory controller 210, an audio/video decoder 212a having video decoder circuitry 214, a mixer/encoder 216a, an on-screen generator (OSG) 218a, various peripherals 220 and a direct memory access (DMA) engine 222. The decoder 200 may be defined in an RTL source file provided to the DBT for size reduction. A high clock frequency (e.g., 162 MHz) for the processor module 208 may be used as a candidate maximum clock frequency for implementing DBT in the decoder 200a. Modules that normally operate from clocks running below 162 MHz may be modified to include bitslice datapaths operating at the 162 MHz clock frequency. An accounting of the modules in the decoder 200a may be provided in Table I as follows:

TABLE I

| Module | Gate Count | Clock Frequency |
| --- | --- | --- |
| DTV Xport | 80,000 | 66 MHz |
| Parsnip block | 10,000 | 54 MHz |
| DVB Xport p-p logic | 80,000 | 66 MHz |
| DVB Xport logic | 220,000 | 54 MHz/ 81 MHz memory |
| A/V decoder | 351,000 w/o memory 641,000 with memory | 27 and 54 MHz 81 MHz memory |
| Mixer | 95,000 | 54 MHz |
| OSG | 86,000 w/o memory 131,000 with memory | 54 MHz 81 MHz memory |
| SG2 | 50,000 w/o memory (Virage is 1.6 mmsq) | 81 MHz |
| Processor | N/A | 162 MHz |
| Memory controller | N/A | 162 MHz |
| Peripherals | N/A | 27 and 54 MHz 81 MHz memory |
| DMA | N/A | 162 MHz |

Without considering memory, a total gate count for the candidate modules is approximately 1.2 million gates. Adding the gate count for memory increases the total gate count to approximately 1.9 million gates.

Figure 5:
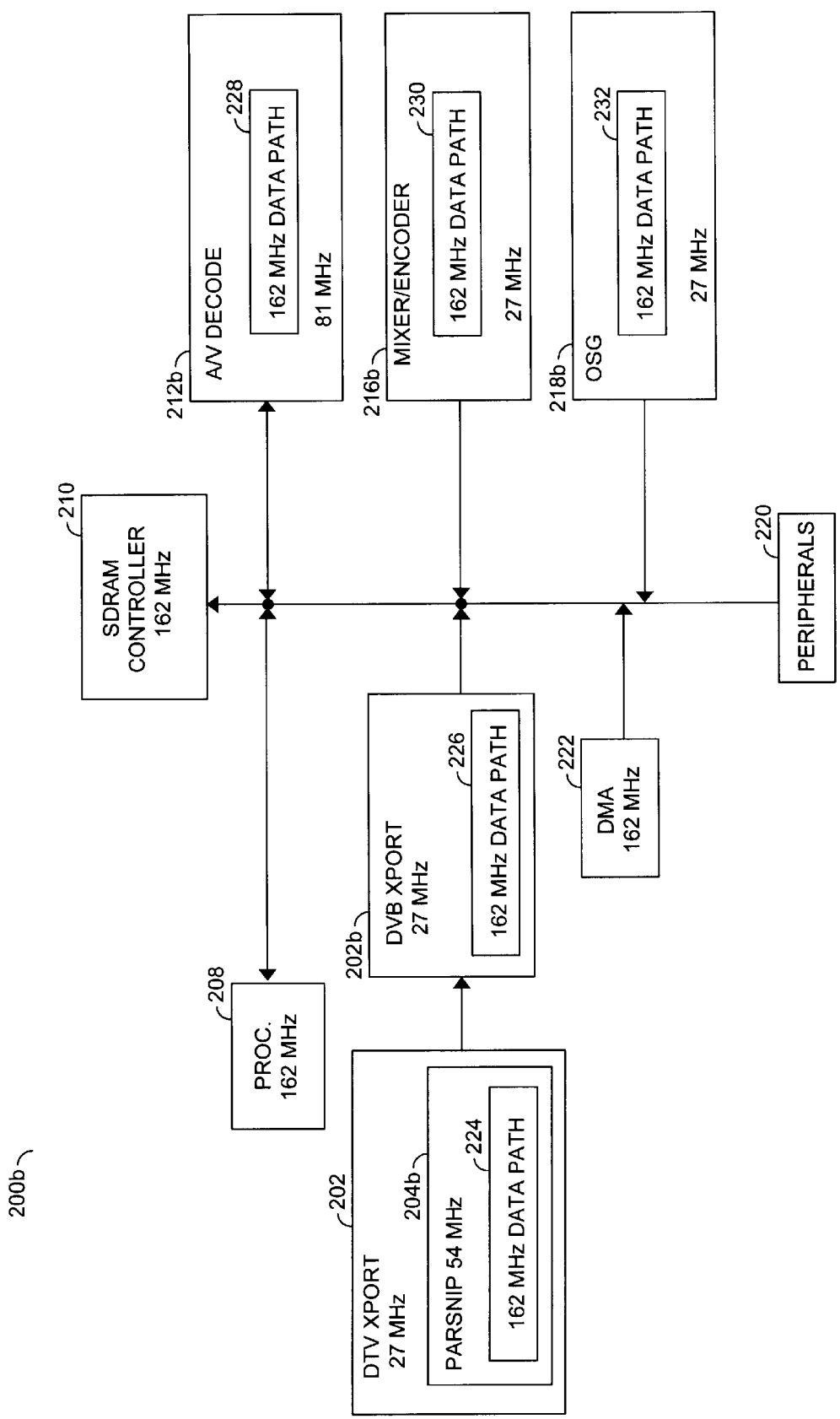
FIG. 5 is a block diagram of the example digital video decoder after size reduction.

Referring to FIG. 5, a block diagram of the example decoder 200a after size reduction is shown. The new decoder 200b generally comprises the digital television Xport 202 having a rearranged parsnip block 204b, the processor 208, the memory controller 210, a rearranged audio/video decoder 212b, a rearranged mixer/encoder 216b, a rearranged on-screen generator 218b, the peripherals 220 and the DMA engine 222. The rearranged parsnip block 204b may include a bitslice datapath 224 operating at a higher frequency (e.g., 162 MHz) than the original frequency (e.g., 54 MHz) for the parsnip block 204a. The rearranged digital video broadcast Xport 206b may include another bitslice datapath 226 also operating at the higher frequency. The rearranged audio/video decoder 212b may include a bitslice datapath 228 operating at the higher frequency and configured to emulate the video decode circuitry 214. The rearranged mixer/encoder 216b may include a bitslice datapath 230 operating at the higher frequency. The rearranged on-screen generator 216b may include yet another bitslice datapath 232 operating at the higher frequency.

Figure 6:
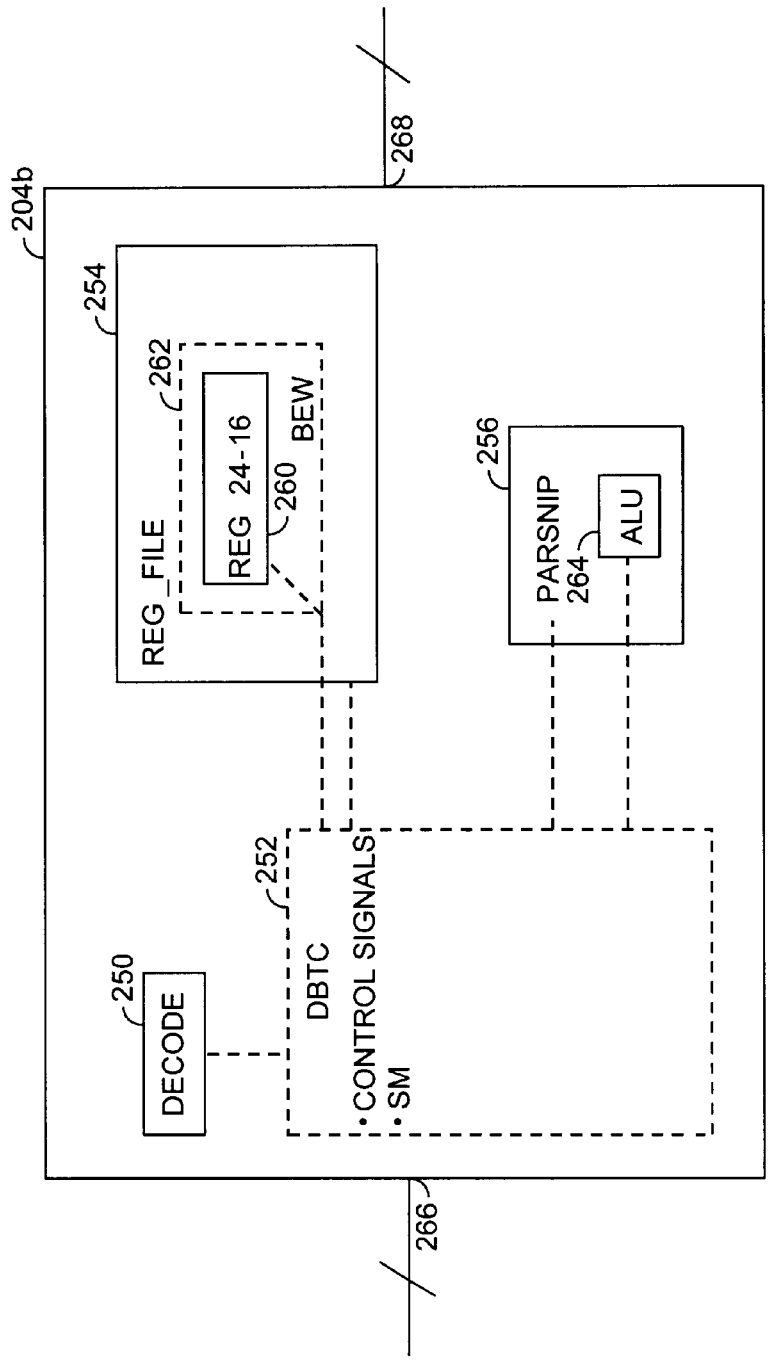
FIG. 6 is a block diagram of and example implementation of the parsnip block using a datapath bitslice technology.

Referring to FIG. 6, a block diagram of and example implementation of the parsnip block 204b using DBT is shown. The parsnip block 204b generally comprises a decode block 250, a DBT control block 252, a register block 254 and a parsnip function block 256. The register block 254 may comprise multiple (e.g., 16) registers 260 in a bitslice emulation wrapper (BEW) 262. The parsnip function block 256 generally has an arithmetic logic unit (ALU) 264. The input/output interfaces 266 and 268 of the parsnip block 204b may be identical to the same interfaces for the original parsnip block 204a.

Several steps may be performed to edit the user parameter file 104 to achieve the parsnip block 204b. The following steps may also be applied to other applications to reduce other modules and/or blocks. A grep (searching files for lines matching a regular expression) of the existing VHDL RTL source file 102 for a particular bit width may be performed. The grep generally provides specific code line information on where the code may be adding the bitsliced width to the datapath. The search criteria may be edited manually or with a script or with the DBT tool. The intent of the edit is to generally contract an existing datapath width to a target datapath width. Specifically for the parsnip block 204a, the grep may have '15' as an upper number on a 16-bit width. The upper number may be edited to '8' if the goal is to increase the clock rage from 54 MHz to 108 MHz. The upper number may be edited to '4' if the goal is to increase the clock rate from 54 MHz to 216 MHz.

The VHDL code may then be edited to support the DBT interconnect. In particular, I/O at the VHDL module level may be added to support the DBT controller block 252 for control of the generated bitslice. Specifically for the parsnip block 204b, the edit would be for all five modules and the overall parsnip module I/O would be unchanged except for adding the planned increased clock signals.

The VHDL code may then be edited to support the states from the bitslice operation for use with subsequent bitslice operations, multiplexers and other bitslice support logic. The DBT tool may manifest the support as a memory bitslice logic wrapper. For the parsnip block 204b, internal operations such as shifting may propagate the shift information to the other bitslice operations and thus the information may be stored in the registers 260. Also, multiplexers (not shown) and control for the multiplexers may be added such that register information for the next bitslice operation may also be added.

The DBT tool may generate the control state machine within the DBT control module 252 and control signals as appropriate. For the parsnip block 204a, if the '8' bitslice is used, the state machine would be implemented with two states, a first state for the lower 8 bits of processing and a second state for the upper 8 bits of processing.

Figure 7:
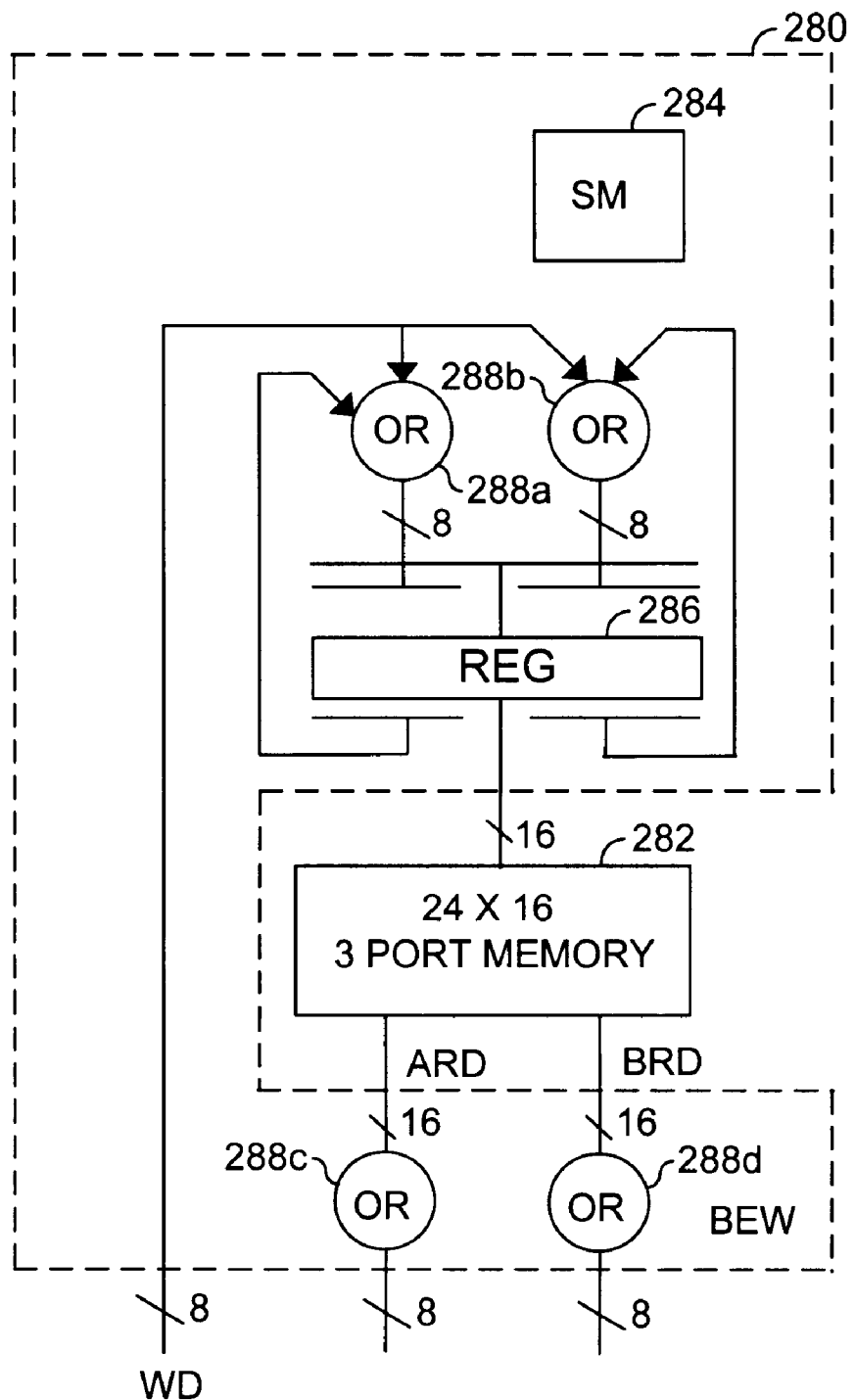
FIG. 7 is a block diagram of an example implementation of a bitslice emulator wrapper for a parsnip 3-port memory.

Referring to FIG. 7, a block diagram of an example implementation of a bitslice emulator wrapper 280 for a parsnip 3-port memory 282 is shown. The bitslice emulation wrapper 280 generally comprises a state machine block 284, a register 286 and multiple logic blocks 288a–d. The bitslice emulation wrapper 280 may receive write data (e.g., WD) for storage in the 3-port memory 282. The write data WD (e.g., 8-bits) may be multiplexed by the logic blocks 288a and 288b to either an upper half or lower half of the register 286. From the register 286, the write data WD may be written into the memory block 282 through a first port as part of a larger (e.g., 16-bit) word. Data (e.g., Ard and Brd) may be read from a second port and a third port of the memory block 282 to the logic blocks 288c and 288d, respectively.. The logic blocks 288c and 288d may be arranged to extract read data from either the upper or the lower half of the read data Ard and Brd, respectively.

Figure 8:
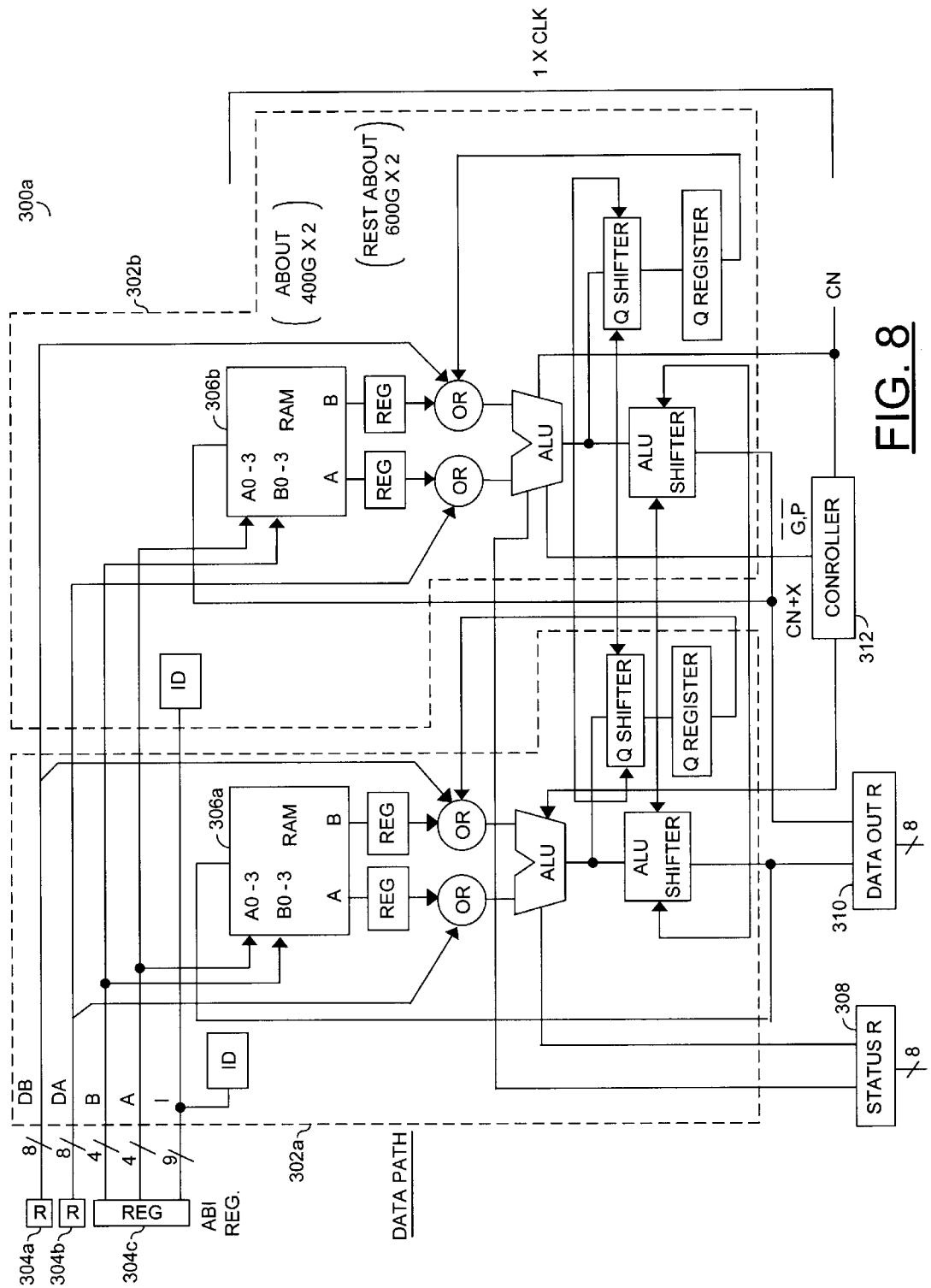
FIG. 8 is a block diagram of another example implementation of a central processor unit (CPU)

Referring to FIG. 8, a block diagram of another example implementation of a central processor unit (CPU) 300a is shown. The CPU 300a may illustrate an 8-bit processor arranged as two parallel 4-bit processors 302a–302b operating in parallel from a clock signal having a rate of '1x' and implemented in approximately 2000 gates. Each of the processors 302a and 302b may include a memory block 306a and 306b, respectively. The processors 302a and 302b may share a common set of input registers 304a–c, a common status register 308, a common data output register 310 and a common controller 312. Processing of input data signals (e.g., DA and DB) may be accomplished in a single clock cycle.

Figure 9:
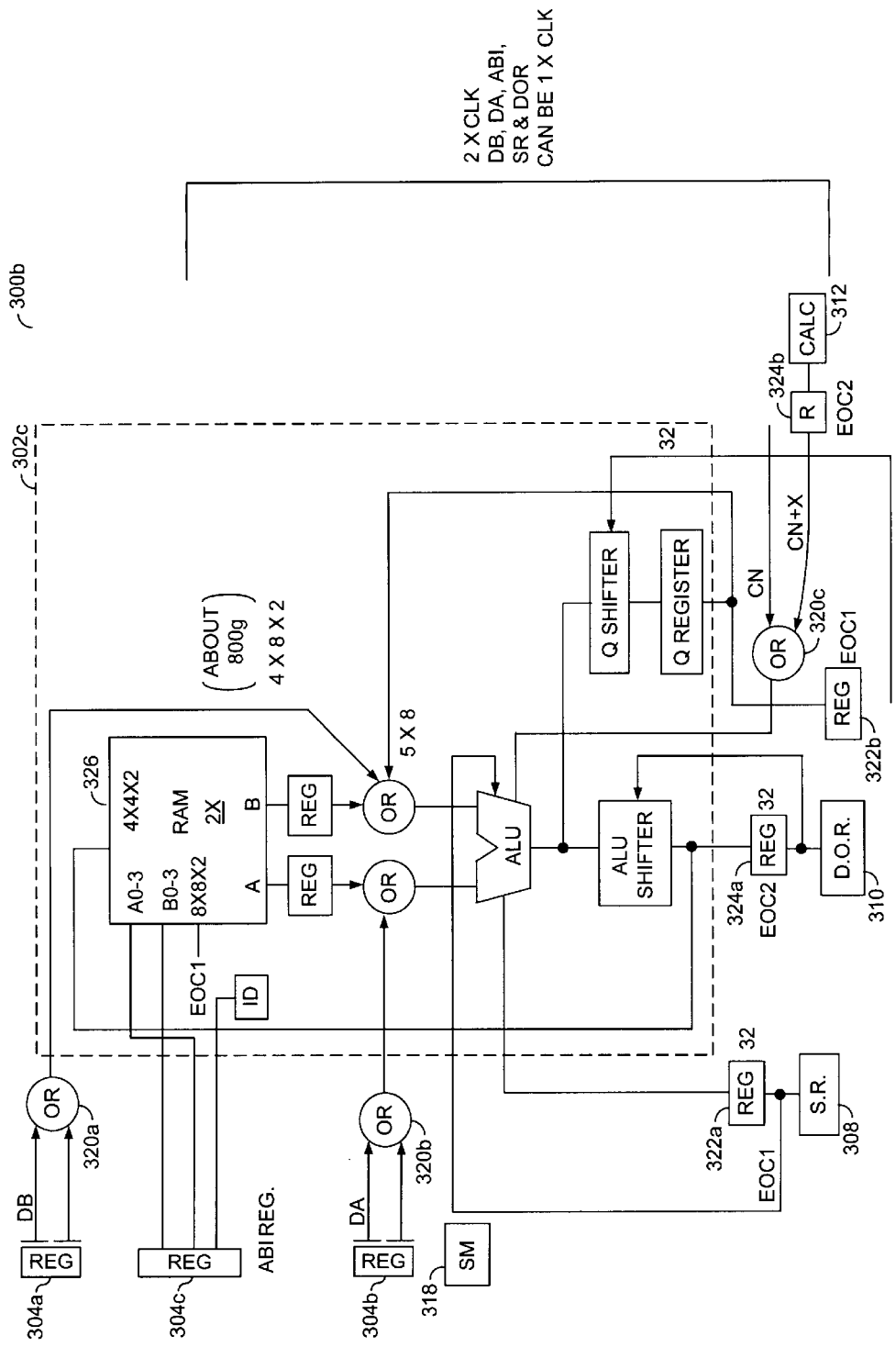
FIG. 9 is a block diagram of the CPU after reduction using the datapath bitslice technology.

Referring to FIG. 9, a block diagram of the CPU 300a after reduction using the DBT is shown. The modified CPU 300b generally comprises a single 4-bit processor 302c, the input registers 304a–c, the status register 308, the data output register 310, the control block 312, a state machine 318, multiple logic blocks 320a–c, multiple end-of-cycle-one (EOC1) registers 322a–b and multiple end-of-cycle-two (EOC2) registers 324a–b. The 4-bit processor 302c may be similar to the 4-bit processors 302a and 302b with a larger memory block 326 and a faster clock signal (e.g., a '2x' rate clock). The logic blocks 320a–c may be controlled by the state machine block 418 to multiplex upper and lower halves of the data signals DA, DB and control signals (e.g.,Cn and Cn+x) into the processor 302c. The EOC1 registers 322a–b may be added to the CPU 300b to store status and data generated during a first cycle of the processor 302c. The EOC2 registers 324a–b may added to the CPU 300b to store data and control information generated during a second cycle of the processor 302c. The first pass through the processor 302c basically emulates the functionality of the processor 302a. The second pass through the processor 302c basically emulates the functionality of the processor 302b. Therefore, implementing two passes through the processor 302c of the CPU 300b using the doubled '2x' clock rate generally recreates the functionality and timing of the two processors 302a and 302b from the CPU 300a.

In terms of size (e.g., gate count), the CPU 300b implemented with the DBT may use approximately 1600 gates, which is about 20% (e.g., (2000–1600)/2000) fewer gates than used in the CPU 300a without the DBT. The number of gates used in the CPU 300b for the memory 326 is approximately the same (e.g., 800 gates) as a sum of both the memories 306a and 306b. About 200 additional gates may be added to the CPU 300b to implement a BEW around the memory 326 and a DBT controller (e.g., state machine block 420). However, the memory 326 may be accessed four bits at a time while the memories 306a and 306b may be accessed eight bits at a time. Not taking the memories 306a, 306b and 326 into account, the DBT approach may result in a savings of approximately 33% (e.g., (1200–800)/1200 gates). The size savings generated by the DBT method may be promulgated into other applications. In general, if a datapath bit width is halved, the gate savings may be in a range of approximately 20% to 33%. In turn, the gate savings typically reduce the silicon size in a linearly proportional way.

In another example (not illustrated), a satellite channel silicon chip may have approximately 200,000 gates that occupy about a 3.9×3.9 mm area. Most of the clocks (e.g., 90%) in the satellite channel circuit operation at 90 MHz. Re-engineering the satellite channel circuit using DBT to just increase the clock speeds to 180 MHz generally saves approximately 20% of the gate count. The 180 MHz clock rates may be reasonable to implement considering that a 162 MHz clock rate is a minimum upper limit, as the memory and CPU operations for conventional satellite channel designs have achieved 162 MHz in static timing analysis. In other examples, a single chip cable set top box circuit, cable modem circuit and the like may have multiple modules size-reduced on internal datapaths.

Each next generation ASIC process technology advance generally provides more density and performance than the previous technologies. For many ASICs, however, performance in terms of clock cycles may not be a high priority whereas reduced silicon size may be very important. The DBT approach may be used to reduce silicon size on various ASIC datapaths that may not already operating at an upper rate limit of a clock signal in the ASIC. The DBT may be implemented as a formal computer aided design tool that may exist as part of an ASIC development flow.

The DBT may be independent of the RTL languages and the simulator or the synthesis operations used in the ASIC flow. The independence may enable a successful deployment of a new tool to ASIC design centers. The tool may be developed to be adequately robust to handle different RTL styles and tool interfaces. Also, DBT may be a design center activity only, such as for an RTL sign-off. The reduced silicon size may be reflected in lower fabrication costs and a component of the savings may be passed on to the customer.

Cores are generally functional blocks used in ASICs. Cores may be generated in-house from customer or from third party specifications. Cores may be manifested in ASSPs as well as ASICs. Cores may be "soft", such as a CPU core, or "hard", like a standardized digital subscriber line physical layer core. Cores generally benefit from DBT in that internal datapaths may have faster clock speeds and reduced silicon size while preserving the I/O functionality and transfer speeds to pre-DBT operations. For CPUs, some applications may have silicon size as a priority over performance. For example, a 32-bit CPU that runs at 100 MHz may be less compelling than a 16-bit CPU of equal performance that runs at 200 MHz while emulating the 32-bit CPU using 25% less silicon area.

In general, the DBT may permit selective modules to achieve a reduce silicon size. The reduced modules may preserve the existing I/O and I/O timing such that related module edits may be avoided and existing simulation verification test benches and patterns may be used unaltered. Therefore, the DBT is essentially non-intrusive to the rest of the RTL code. A portion of the present invention may be implemented, such as the process of using faster clocks on a bitslice representation of the logic, to emulate the existing logic.

The function performed by the flow diagram of FIG. 1 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMS, RAMs, EPROMs, EEPROMS, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

What is claimed is:

1. A method for reducing circuit gate count comprising the steps of:

(A) generating a new file from a source file and a parameter file, wherein said source file comprises a first circuit defined in a hardware description language, said new file comprises a second circuit defined in said hardware description language, said parameter file comprises a second clock frequency for said second circuit that is faster than a first clock frequency for said first circuit, and said first circuit is functionally equivalent to said second circuit;

(B) generating a first gate count by synthesizing a first design from said source file;

(C) generating a second gate count by synthesizing a second design from said new file; and (D) generating a statistic by comparing said first gate count to said second gate count.

2. The method according to claim 1, wherein generating said new file comprises the steps of:

parsing said first circuit into a plurality of blocks; and replacing a first block of said blocks with a second block that (i) is functionally equivalent to said first block and (ii) operates at said second clock frequency.

3. The method according to claim 2, further comprising the step of:

generating said second block to incorporate a reset function from said first circuit.

4. The method according to claim 2, further comprising the step of:

generating said second block to match a peripheral interface of said first block.

5. The method according to claim 1, further comprising the step of:

automatically updating said parameter file based upon said statistic.

6. The method according to claim 5, further comprising the step of:

automatically repeating step (A) through step (D) after updating said parameter file to generate a plurality of said second circuits.

7. The method according to claim 6, wherein repeating step (A) through step (D) is repeated until a predetermined constraint is achieved.

8. The method according to claim 6, further comprising the step of:

assessing a difference in size among each of said second circuits.

9. The method according to claim 8, further comprising the step of:

identifying a signal timing analysis challenges presented by each of said second circuits.

10. The method according to claim 1, wherein step (A) further comprises the sub-step of:

generating a plurality of blocks configured as a boundary scan in said second circuit.

11. The method according to claim 1, wherein step(A) further comprises the sub-step of:

parsing said first circuit into a plurality of blocks each having a different clock domain.

12. The method according to claim 1, wherein step (A) further comprises the sub-step of:

generating a bit-width for a datapath in said second circuit based upon said first clock frequency and said second clock frequency.

13. The method according to claim 1, wherein step (A) further comprises the sub-step of:

generating a state machine in said second circuit to control translations of a signal between said first clock frequency and said second clock frequency.

14. The method according to claim 1, further comprising the steps of:

generating a first result by simulating said first design;

generating a second result by simulating said second design; and comparing said first result to said second result to verify that said first circuit is functionally equivalent to said second circuit.

15. The method according to claim 1, wherein step (A) comprises the sub-steps of:

searching said first circuit for a module having a first bit-width greater than a predetermined value; and reducing said first bit-width to a second bit-width inside said module in said second circuit.

16. The method according to claim 15, wherein step (A) further comprises the sub-step of:

generating a control block in said module; and generating an interface between said control block and each of a plurality of blocks within said module.

17. The method according to claim 16, wherein step (A) further comprises the sub-step of:

generating a wrapper block in said module to adapt said blocks to operation with said second bit-width.

18. The method according to claim 17, wherein step (A) further comprises the sub-step of:

generating a plurality of states in said control block to control said blocks and said wrapper block to emulate said first bit-width.

19. A system comprising:

a parameter file comprising a second clock frequency for a second circuit that is faster than a first clock frequency for a first circuit;

a tool configured to (i) generate a new file from a source file and said parameter file and (ii) generate a statistic by comparing a first gate count for a first design synthesized from said source file to a second gate count for a second design synthesized from said new file, wherein said source file comprises said first circuit defined in a hardware description language, said new file comprises said second circuit defined in said hardware description language, and said first circuit is functionally equivalent to said second circuit.

20. The system according to claim 19, wherein said new file comprises:

a second block that (i) is functionally equivalent to a first block of said first circuit and (ii) operates at said second frequency.

21. The system according to claim 20, wherein said parameter file comprises:

a constraint for determining one of (i) maintaining a width of an interface of said first circuit in said second circuit and (ii) narrowing said bit-width in said second circuit.

22. The system according to claim 19, wherein said parameter file further comprises:

a constraint defining said second clock frequency as a multiple of said first clock frequency.

23. The system according to claim 19, wherein said parameter file further comprises:

a constraint to prioritize minimizing a size of said second circuit.

24. The system according to claim 19, wherein said parameter file further comprises:

a constraint to maintain a size of a memory of said first circuit in said second circuit.

25. The system according to claim 19, wherein said parameter file further comprises:

a constraint to generate a wrapper logic around a memory in said second circuit, wherein said wrapper logic divides one transaction for said memory into a plurality of transactions.

26. The system according to claim 25, wherein said constraint comprises:

at least one of (i) a predetermined bit-width for said transactions, (ii) a predetermined bit-width for said memory and (iii) storage of said transactions.

27. The system according to claim 19, wherein said parameter file further comprises:

a constraint to maintain a timing for an interface register of said first circuit in said second circuit.

28. The system according to claim 19, wherein said parameter file further comprises:

a constraint prohibiting a first block of a plurality of blocks in said first circuit from being replaced by second block operating at said second frequency in said second circuit.

29. The system according to claim 19, wherein said parameter file further comprises:

a constraint to optimize a size of said second circuit.

30. The system according to claim 19, wherein said parameter file further comprises:

a constraint to optimize performance for a predetermined type of block.

31. The system according to claim 19, wherein said new file is compliant with a register transfer language.

32. The system according to claim 19, wherein said tool is further configured to generate a report detailing said generation of said new file.

33. The system according to claim 32, wherein said report comprises:

at least one of (i) a bitslice architecture used in said second circuit (ii) said second clock frequency, (iii) a status of registers preserved from said first circuit and (iv) an operational difference between said first circuit and said second circuit.

34. The system according to claim 19, wherein said tool is further configured to:

parse said first circuit into a plurality of datapaths and replace said a first datapaths of said datapaths with a second datapaths that is functionally equivalent to said first datapaths and operates at said second clock frequency.

35. A system comprising:

means for generating a new file from a source file and a parameter file, wherein said source file comprises a first circuit defined in a hardware description language, said new file comprises a second circuit defined in said hardware description language, said parameter file comprises a second clock frequency for said second circuit that is faster than a first clock frequency for said first circuit, and said first circuit is functionally equivalent to said second circuit;

means for generating a first gate count by synthesizing a first design from said source file;

means for generating a second gate count by synthesizing a second design from said new file; and means for generating a statistic by comparing said first gate count to said second gate count.

* * * * *